US009413135B2

(12) United States Patent
Wu et al.

(10) Patent No.: US 9,413,135 B2
(45) Date of Patent: Aug. 9, 2016

(54) FLIP CHIP TYPE LASER DIODE AND FLIP CHIP TYPE LASER DIODE PACKAGE STRUCTURE

(71) Applicant: PlayNitride Inc., Tainan (TW)

(72) Inventors: Chih-Ling Wu, Tainan (TW); Yu-Yun Lo, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/732,804

(22) Filed: Jun. 8, 2015

(65) Prior Publication Data

US 2015/0372450 A1    Dec. 24, 2015

(30) Foreign Application Priority Data

Jun. 20, 2014   (TW) .............................. 103121394 A

(51) Int. Cl.
| | |
|---|---|
| *H01S 5/00* | (2006.01) |
| *H01S 5/022* | (2006.01) |
| *H01S 5/227* | (2006.01) |
| *H01S 5/042* | (2006.01) |

(52) U.S. Cl.
CPC ............. *H01S 5/0224* (2013.01); *H01S 5/0425* (2013.01); *H01S 5/227* (2013.01)

(58) Field of Classification Search
CPC ...... H01S 5/0224; H01S 5/227; H01S 5/0425
See application file for complete search history.

(56) References Cited

U.S. PATENT DOCUMENTS

| | | | | |
|---|---|---|---|---|
| 2012/0189029 | A1* | 7/2012 | Kashiwagi | ............. B82Y 20/00 372/44.011 |
| 2012/0309121 | A1* | 12/2012 | Yoneda | ............... H01S 5/02272 438/31 |
| 2013/0277641 | A1* | 10/2013 | Li | ........................... H01L 33/60 257/13 |

\* cited by examiner

*Primary Examiner* — Yuanda Zhang
(74) *Attorney, Agent, or Firm* — Jianq Chyun IP Office

(57) ABSTRACT

A flip chip type laser diode includes a first substrate, a first semiconductor layer disposed on the first substrate, an emitting layer disposed on one part of the first semiconductor layer, a second semiconductor layer disposed on the emitting layer and forming a ridge mesa, a current conducting layer disposed on another part of the first semiconductor layer, a patterned insulating layer covering the second semiconductor layer and the current conducting layer and including a first zone and a second zone which respectively expose a part of the current conducting layer and a part of the second semiconductor layer, a first electrode and a second electrode respectively disposed on the first zone and the second zone. A projection of the ridge mesa projected to the first substrate covers a part of projections of the first electrode and the second electrode projected to the first substrate.

6 Claims, 4 Drawing Sheets

FLIP CHIP TYPE LASER DIODE AND FLIP CHIP TYPE LASER DIODE PACKAGE STRUCTURE

CROSS-REFERENCE TO RELATED APPLICATION

This application claims the priority benefit of Taiwan application serial no. 103121394, filed on Jun. 20, 2014. The entirety of the above-mentioned patent application is hereby incorporated by reference herein and made a part of this specification.

BACKGROUND OF THE INVENTION

1. Field of the Invention

The invention relates to a laser diode and a laser diode package structure, and particularly relates to a flip chip type laser diode and a flip chip type laser diode package structure.

2. Description of Related Art

FIG. 1 is a cross-sectional schematic view illustrating a conventional laser diode. Referring to FIG. 1, a conventional laser diode 10 includes a substrate 11, a first semiconductor layer 12, an emitting layer 13, a second semiconductor layer 14, a patterned insulating layer 15, a first electrode 16, a second electrode 17, and two conductive wires 18. The first semiconductor layer 12 is disposed on the substrate 11. The emitting layer 13 is disposed on a part of the first semiconductor layer 12. The second semiconductor layer 14 is disposed on the emitting layer 13 and forms a ridge mesa. The patterned insulating layer 15 covers a part of the second semiconductor layer 14. The first electrode 16 is disposed on the first semiconductor layer 12, the second electrode 17 is disposed on an area of the second semiconductor layer 14 that is not covered by the patterned insulating layer 15, and one end of each of the conductive wires 18 respectively extend from the first electrode 16 and the second electrode 17.

As shown in FIG. 1, the conventional laser diode 10 is electrically connected with an external part through bonding wire. However, the bonding wire structure takes up more space. For example, a width of one single solder pad in the bonding wire structure takes up 100 micrometers, making it difficult to reduce the conventional laser diode in space.

SUMMARY OF THE INVENTION

The invention provides a flip chip type laser diode having a narrower width.

The invention provides a flip chip type laser diode package structure including the flip chip type laser diode.

A flip chip type laser diode according to the embodiments of the invention includes a first substrate, a first semiconductor layer, an emitting layer, a second semiconductor layer, at least one current conducting layer, a patterned insulating layer, first electrode, and a second electrode. The first semiconductor layer is disposed on the first substrate. The emitting layer is disposed on a part of the first semiconductor layer. The second semiconductor layer is disposed on the emitting layer and forms a ridge mesa. The at least one current conducting layer is disposed on a part of the first semiconductor layer. In addition, the at least one current conducting layer is electrically connected with the first semiconductor layer and isolated from the second semiconductor layer. The patterned insulating layer covers the first semiconductor layer, the emitting layer, the second semiconductor layer, and the current conducting layer. In addition, the patterned insulating layer includes a first zone and a second zone. The first zone exposes a part of the current conducting layer, and the second zone exposes a part of the second semiconductor layer. The first electrode is disposed on the first zone of the patterned insulating layer, and the second electrode is disposed on the second zone of the patterned insulating layer. A projection of the ridge mesa projected to the first substrate respectively covers a part of a projection of the first electrode and a part of a projection of the second electrode projected to the first substrate.

According to an embodiment of the invention, the number of the at least one current conducting layer is one, and the current conducting layer is located at one side of the ridge mesa.

According to an embodiment of the invention, the number of the at least one current conducting layer is two, and the two current conducting layers are located at two sides of the ridge mesa.

According to an embodiment, a cross-section of the flip chip type laser diode crosscuts the ridge mesa and the at least one current conducting layer, and a width of the cross-section of the flip chip type laser diode is less than 100 micrometers.

According to an embodiment of the invention, a cross-section of the flip chip type laser diode crosscuts the ridge mesa and the at least one current conducting layer, a ratio between a width of the ridge mesa and a width of the cross-section of the flip chip type laser diode is approximately from 0.01 to 0.5, and a range of the width of the ridge mesa is approximately from 1 to 50 micrometers.

According to an embodiment of the invention, the first electrode and the second electrode are electrically connected with a third electrode and a fourth electrode of a package substrate.

A flip chip type laser diode package structure of the invention includes a package substrate and a flip chip type laser diode flipped on and electrically connected with the package substrate. A flip chip type laser diode includes a first substrate, a first semiconductor layer, an emitting layer, a second semiconductor layer, at least one current conducting layer, a patterned insulating layer, a first electrode, and a second electrode. The first semiconductor layer is disposed on the first substrate. The emitting layer is disposed on a part of the first semiconductor layer. The second semiconductor layer is disposed on the emitting layer and forms a ridge mesa. The at least one current conducting layer is disposed on a part of the first semiconductor layer. In addition, the at least one current conducting layer is electrically connected with the first semiconductor layer and isolated from the second semiconductor layer. The patterned insulating layer covers the first semiconductor layer, the emitting layer, the second semiconductor layer, and the current conducting layer. In addition, the patterned insulating layer includes a first zone and a second zone. The first zone exposes a part of the current conducting layer, and the second zone exposes a part of the second semiconductor layer. The first electrode is disposed on the first zone of the patterned insulating layer, and the second electrode is disposed on the second zone of the patterned insulating layer. A projection of the ridge mesa projected to the first substrate respectively covers a part of a projection of the first electrode and a part of a projection of the second electrode projected to the first substrate. The package substrate includes a second substrate, a third electrode, and a fourth electrode. The third electrode is disposed on a part of the second substrate and contacts the first electrode. The fourth electrode is disposed on a part of the second substrate and kept a distance from the third electrode, wherein the fourth electrode contacts the second electrode.

According to an embodiment of the invention, the number of the at least one current conducting layer is one, and the current conducting layer is located at one side of the ridge mesa.

According to an embodiment of the invention, the number of the at least one current conducting layer is two, and the two current conducting layers are located at two sides of the ridge mesa.

According to an embodiment, a cross-section of the flip chip type laser diode crosscuts the ridge mesa and the at least one current conducting layer, and a width of the cross-section of the flip chip type laser diode is less than 100 micrometers.

According to an embodiment of the invention, a cross-section of the flip chip type laser diode crosscuts the ridge mesa and the at least one current conducting layer, a ratio between a width of the ridge mesa and a width of the cross-section of the flip chip type laser diode is approximately from 0.01 to 0.5, and a range of the width of the ridge mesa is approximately from 1 to 50 micrometers.

Based on the above, the flip chip type laser diode of this invention is packaged into the flip chip type laser diode package structure by bonding with the package substrate through the first electrode and the second electrode by direct bonding. Such design saves the area taken up by the bonding wire structure for bonding wire connection in the conventional art, so the width of the flip chip type laser diode is significantly reduced. Moreover, the flip chip type laser diode of the invention allows the first electrode and the second electrode to be disposed along the extending direction of the ridge mesa through the configuration that the first zone and the second zone of the patterned insulating layer are arranged along the extending direction of the ridge mesa, and the patterned insulating layer exposes a part of the current conducting layer in the first zone and a part of the second semiconductor layer in the second zone. In other words, the flip chip type laser diode has only one electrode present in any cross-section which crosscuts the ridge mesa and the current conducting layer, so the width of the flip chip type laser diode is further reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
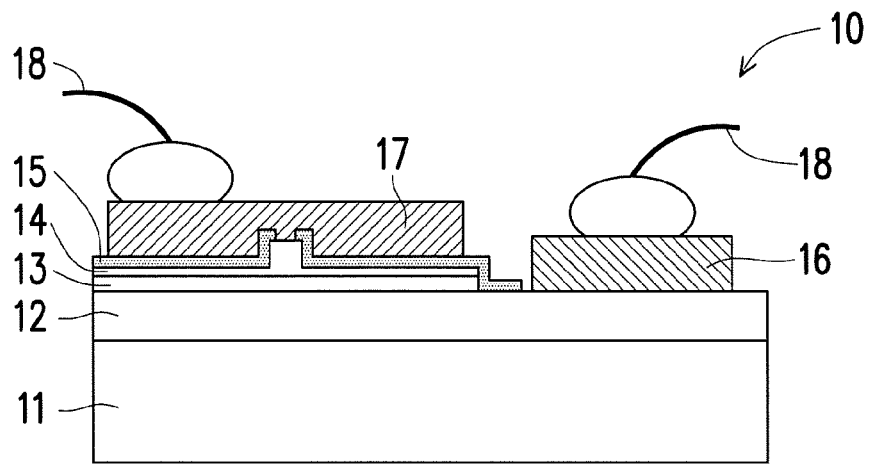
FIG. 1 is a schematic view illustrating a conventional laser diode.

Reference will now be made in detail to the present preferred embodiments of the invention, examples of which are illustrated in the accompanying drawings. Wherever possible, the same reference numbers are used in the drawings and the description to refer to the same or like parts.

Figure 2:
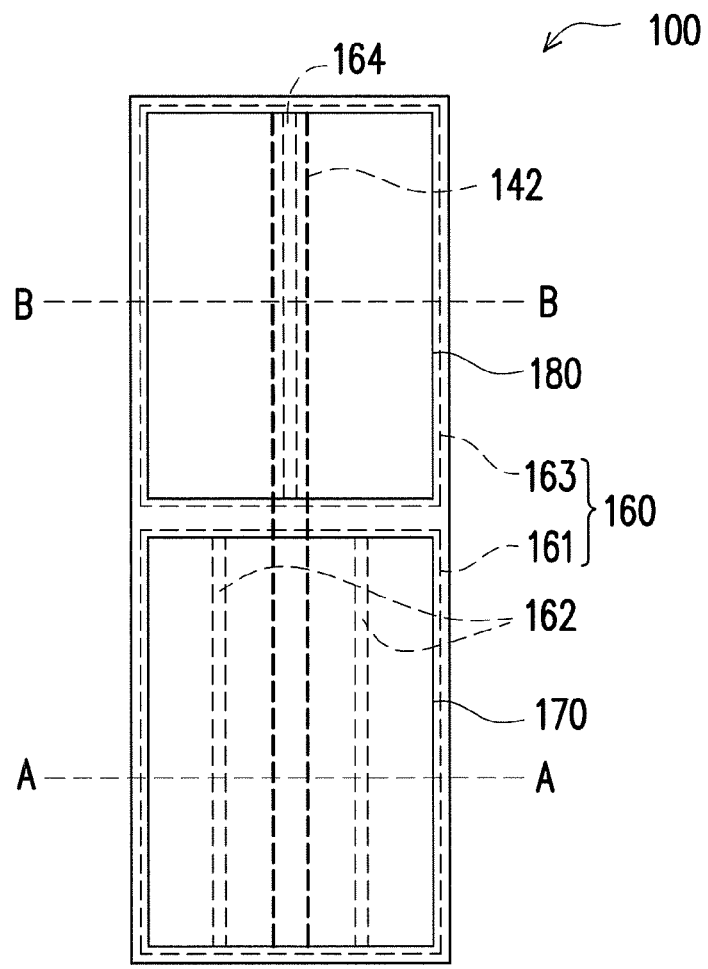
FIG. 2 is a top schematic view illustrating a flip chip type laser diode according to an embodiment of the invention.
Figure 3:
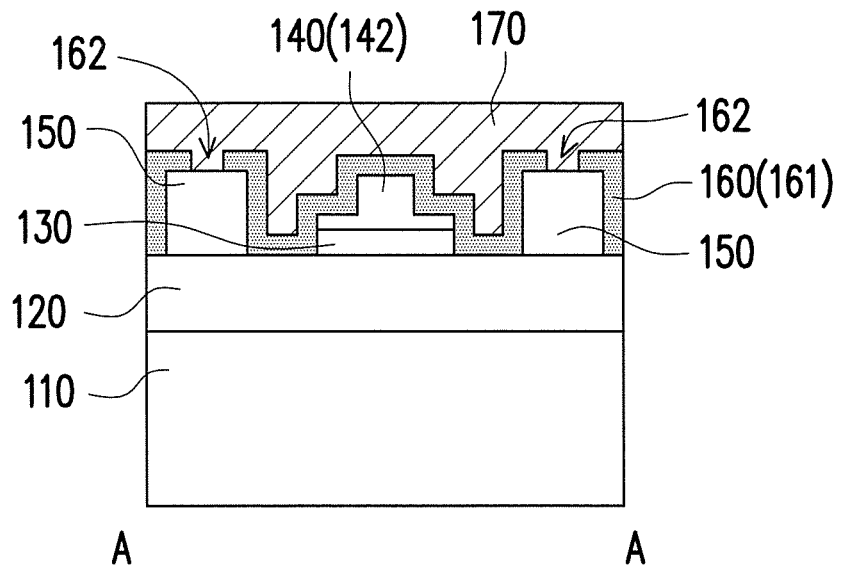
FIG. 3 is a cross-sectional schematic view illustrating the flip chip type laser diode shown in FIG. 2 along a A-A line segment.
Figure 4:
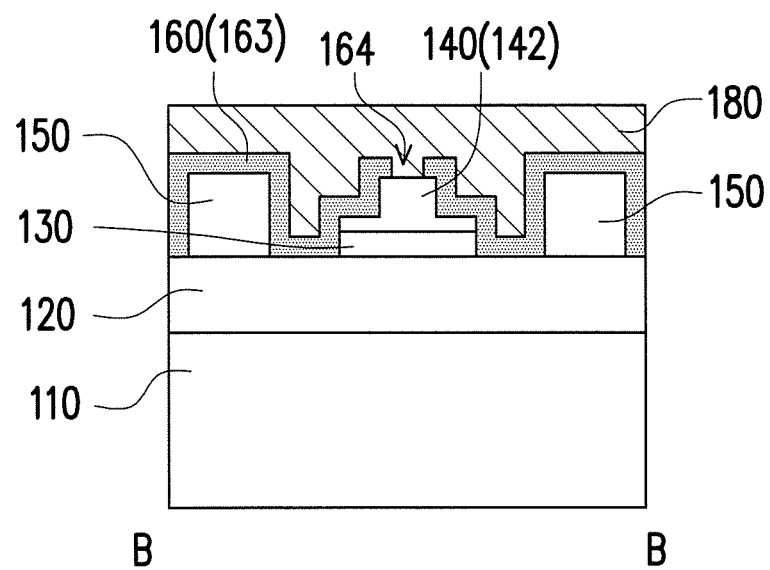
FIG. 4 is a cross-sectional schematic view illustrating the flip chip type laser diode shown in FIG. 2 along a B-B line segment.

FIG. 2 is a top schematic view illustrating a flip chip type laser diode according to an embodiment of the invention. FIG. 3 is a cross-sectional schematic view illustrating the flip chip type laser diode shown in FIG. 2 along a A-A line segment. FIG. 4 is a cross-sectional schematic view illustrating the flip chip type laser diode shown in FIG. 2 along a B-B line segment. Referring to FIGS. 2-4, a flip chip type laser diode 100 of this embodiment includes a first substrate 110, a first semiconductor layer 120, an emitting layer 130, a second semiconductor layer 140, at least one current conducting layer 150, a patterned insulating layer 160, a first electrode 170, and a second electrode 180.

In this embodiment, the substrate 110 is a sapphire substrate, for example. However, the substrate 110 may be other kinds of substrates, such as a substrate made of Si, $SiO_2$, GaN, MN, spinnel, SiC, GaAs, $Al_2O_3$, $LiGaO_2$, $LiAlO_2$, or $MgAl_2O_4$, etc. However, the substrate 110 is not limited thereto.

As shown in FIGS. 3 and 4, the first semiconductor layer 120 is disposed on the substrate 110. In this embodiment, the first semiconductor layer 120 is an N-type semiconductor layer. The emitting layer 130 is disposed on a part of the first semiconductor layer 120. More precisely, the emitting layer 130 is disposed on a center position of the first semiconductor layer 120. The second semiconductor layer 140 is disposed on the emitting layer 130 and forms a protruding ridge mesa 142. In this embodiment, the ridge mesa 142 extends along a length direction of the flip chip type laser diode 100 shown in FIG. 2. In addition, the second semiconductor layer 140 is a P-type semiconductor layer.

The at least one current conducting layer 150 is disposed on a part of the first semiconductor layer 120. In this embodiment, the at least one current conducting layer 150 includes two current conducting layers 150. The current conducting layers 150 are respectively disposed at two sides of the ridge mesa 142. The current conducting layers 150 are electrically connected to the first semiconductor layer 120 and isolated from the second semiconductor layer 140.

Back to FIG. 2, the patterned insulating layer 160 includes a first zone 161 and a second zone 163 arranged along an extending direction of the ridge mesa 142 (i.e. the length direction of the flip chip type laser diode 100 shown in FIG. 2). The first zone 161 has two hollow areas 162, and the second zone 163 has a hollow area 164. The first electrode 170 is disposed on the first zone 161 of the patterned insulating layer 160, and the second electrode 180 is disposed on the second zone 163 of the patterned insulating layer 160. In this embodiment, the first electrode 170 is an N-type electrode, and the second electrode 180 may be a P-type electrode.

More specifically, as shown in FIG. 3, each hollow area 162 of the first zone 161 of the patterned insulating layer 160 exposes a small part of the corresponding current conducting layer 150, and the first zone 161 of the patterned insulating layer 160 covers rest of the current conducting layers 150, the first semiconductor layer 120 between the second semiconductor layer 140 and each of the current conducting layers 150, and the second semiconductor layer 140. The first electrode 170 located on the first zone 161 is conducted to the first semiconductor layer 120 through the current conducting layers 150.

As shown in FIG. 4, the hollow area 164 of the second zone 163 of the patterned insulating layer 160 exposes a top surface of the ridge mesa 142 of the second semiconductor layer 140, and the second zone 163 of the patterned insulating layer 160 covers rest of the second semiconductor layer 140, the first semiconductor layer 120 between the second semiconductor layer 140 and each of the current conducting layers 150, and the current conducting layers 150. The second electrode 180 located on the second zone 163 directly contacts and is conductive to the second semiconductor layer 140. In this embodiment, since the ridge mesa 142 extends along the length direction of the flip chip type laser diode 100, a projection of the ridge mesa 142 projected to the first substrate 110 covers a part of a projection of the first electrode 170 and a part of a projection of the second electrode 180 projected to the first substrate 110, respectively.

It should be noted that in FIG. 2, since the first zone 161 and the second zone 163 of the patterned insulating layer 160 are covered by the first electrode 170 and the second electrode 180, the first zone 161 and the second zone 163 of the patterned insulating layer 160 are represented with broken lines having similar profiles with those of the first electrode 170 and the second electrode 180. However, in other embodiments, areas of the first zone 161 and the second zone 163 of the patterned insulating layer 160 may be smaller or bigger than areas of the first electrode 170 and the second electrode 180. Sizes and relative positions of the first zone 161 and the second zone 163 of the patterned insulating layer 160 and the first electrode 170 and the second electrode 180 are not limited thereto.

The flip chip type laser diode 100 of this embodiment is bonded to a package substrate (e.g. a package substrate 30 shown in FIG. 5) through the first electrode 170 and the second electrode 180 by direct bonding. Therefore, an area taken up by a bonding wire structure for connecting an external part in the conventional structure may be saved. Specifically speaking, a substantial light-emitting area of the laser diode is merely located at the ridge mesa at the center. Thus, in theory, the laser diode has a smaller width. However, a width of the conventional laser diode is not able to be reduced because the bonding wire structure takes up a certain amount of space (e.g. a single solder pad takes up a width of 100 micrometers). The flip chip type laser diode 100 of this embodiment is capable of replacing the bonding wire structure with the first electrode 170 and the second electrode 180 being directly bonded to the package substrate, and thus is able to effectively reduce the width of the flip chip type laser diode 100.

Back to FIG. 2, the design that the first zone 161 and second zone 163 of the patterned insulating layer 160 are arranged along the extending direction of the ridge mesa 142 and the first electrode 170 and the second electrode 180 are disposed in the first zone 161 and the second zone 163 in this embodiment allows the first electrode 170 and the second electrode 180 to be disposed along the length direction of the flip chip type laser diode 100 (i.e. the extending direction of the ridge mesa 142). In other words, only one single electrode is present in a width direction of the flip chip type laser diode 100. As shown in FIGS. 3 and 4, only one single electrode is present in any cross-section which crosscuts the ridge mesa 142 and the current conducting layers 150 of the flip chip type laser diode 100. Thus, the width of the flip chip type laser diode 100 is further reduced.

Compared to the conventional laser diode, where the solder pad of the bonding wire structure alone takes up a width of approximately 100 micrometers, the overall width of the flip chip type laser diode 100 (i.e. a width of the cross-section which crosscuts the ridge mesa 142 and the current conducting layers 150) of this embodiment may be reduced to less than 100 micrometers based on the configuration. Besides, a range of the width of the ridge mesa 142 may be approximately from 1 to 50 micrometers approximately. In this embodiment, a ratio between the width of the ridge mesa 142 and the width of the cross-section (which crosscuts the ridge mesa 142 and the at least one current conducting layer 150) of the flip chip type laser diode 100 may be from 0.01 to 0.5.

Since the flip chip type laser diode 100 of this embodiment has a smaller width, more of the flip chip type laser diodes 100 may be manufactured with one wafer in the manufacturing process. Therefore, a production cost of the flip chip type laser diode 100 may be reduced. Besides, as shown in FIGS. 3 and 4, in this embodiment, the current conducting layers 150 are connected to the first semiconductor layer 120 and are disposed at two sides of the emitting layer 130 and the second semiconductor layer 140. Therefore, currents may flow toward the two sides to be evenly transmitted with a low resistance. Therefore, a device efficiency is improved. Also, the flip chip type laser diode 100 of this embodiment is not connected to the package substrate through bonding wire, so the concern of disconnection is eliminated, and a device reliability is thus improved.

Figure 5:
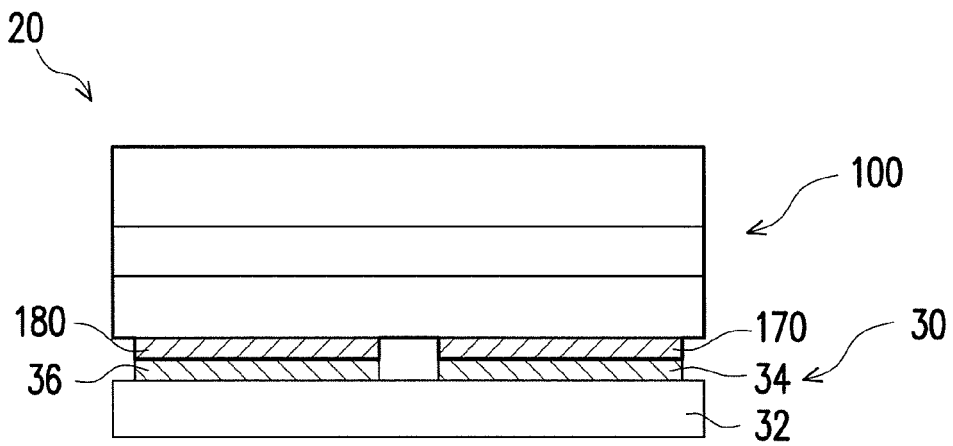
FIG. 5 is a side schematic view illustrating a flip chip type laser diode package structure according to an embodiment of the invention.

FIG. 5 is a side schematic view illustrating a flip chip type laser diode package structure according to an embodiment of the invention. Referring to FIG. 5, a flip chip type laser diode package structure 20 includes a package substrate 30 and the flip chip type laser diode 100 flipped on and electrically connected to the package substrate 30. In this embodiment, the flip chip type laser diode 100 is described using the flip chip type laser diode 100 shown in FIG. 2 as an example. However, the types of the flip chip type laser diode 100 are not limited thereto.

The package substrate 30 includes a second substrate 32, a third electrode 34, and a fourth electrode 36. In this embodiment, the third electrode 34 is an N-type electrode, and the fourth electrode 36 may be a P-type electrode. The third electrode 34 is disposed on a part of the second substrate 32 and contacts the first electrode 170. The fourth electrode 36 is disposed on a part of the second substrate 32, and a distance is kept between the fourth electrode 36 and the third electrode 34. In addition, the fourth electrode 36 contacts the second electrode 180.

In this embodiment, the flip chip type laser diode 100 is connected to the third electrode 34 and the fourth electrode 36 of the package substrate 30 by direct bonding through the first electrode 170 and the second electrode 180 to be packaged into the flip chip type laser diode package structure 20. Since the flip chip type laser diode 100 has a smaller width, an overall width of the flip chip type laser diode package structure 20 may be reduced as well.

In addition, in this embodiment, the second substrate 32 of the package substrate 30 may be formed of a material having a preferable heat dissipation property, such that heat generated by the flip chip type laser diode 100 during operation may be transmitted to the package substrate 30 through the first electrode 170 and the second electrode 180. The material of the second substrate may have a high thermal conductivity, such as AN, to help the flip chip type laser diode 100 dissipate the heat.

Figure 6:
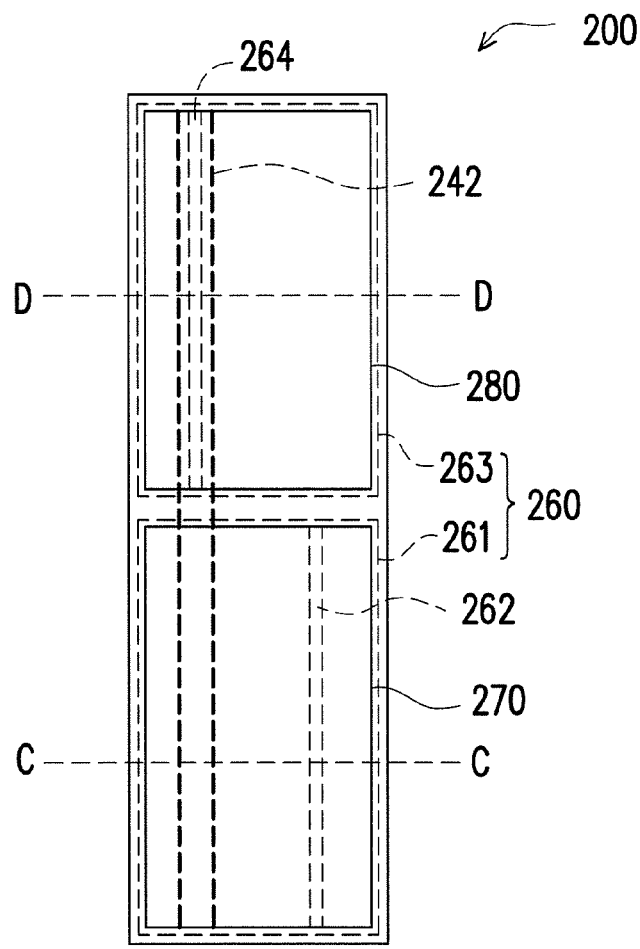
FIG. 6 is a top schematic view illustrating a flip chip type laser diode according to another embodiment of the invention.
Figure 7:
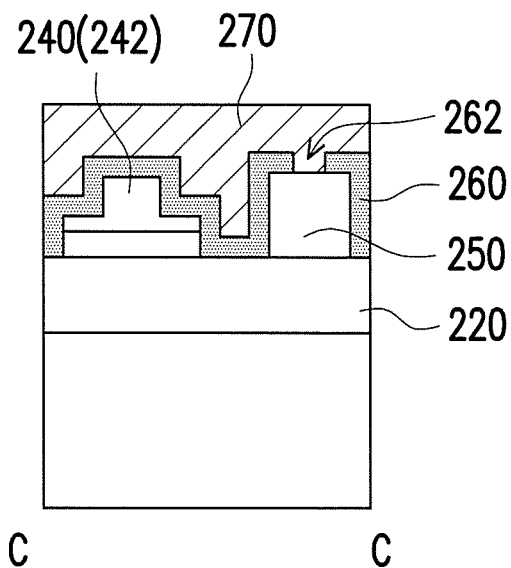
FIG. 7 is a cross-sectional schematic view illustrating the flip chip type laser diode shown in FIG. 6 along a C-C line segment.
Figure 8:
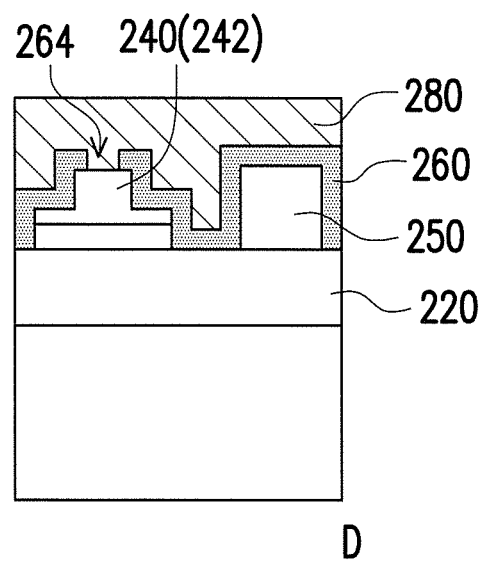
FIG. 8 is a cross-sectional schematic view illustrating the flip chip type laser diode shown in FIG. 6 along a D-D line segment.

FIG. 6 is a top schematic view illustrating a flip chip type laser diode according to another embodiment of the invention. FIG. 7 is a cross-sectional schematic view illustrating the flip chip type laser diode shown in FIG. 6 along a C-C line segment. FIG. 8 is a cross-sectional schematic view illustrating the flip chip type laser diode shown in FIG. 6 along a D-D line segment. Referring to FIGS. 6 to 8, a flip chip type laser diode 200 shown in FIG. 6 mainly differs from the flip chip type laser diode 100 shown in FIG. 2 in that the flip chip type laser diode 100 of FIG. 2 includes two current conducting layers 150, the ridge mesa 142 is located at the center of the flip chip type laser diode 100, and the two current conducting layers 150 are respectively located at two sides of the ridge mesa 142. In this embodiment, the flip chip type laser diode 200 includes only one current conducting layer 250, and a ridge mesa 242 is deviated from the center of the flip chip type laser diode 200, and the current conducting layer 250 is located at one side of the ridge mesa 242.

In FIG. 7, a first zone 261 of a patterned insulating layer 260 has one hollow area 262. The hollow area 262 is located at a position close to the right in the drawing and exposes a small part of the current conducting layer 250. The first zone 261 of the patterned insulating layer 260 covers rest of the current conducting layer 250, a first semiconductor 220 between a second semiconductor layer 240 and the current conducting layer 250, and the second semiconductor layer 240. In FIG. 8, a second zone 263 of the patterned insulating layer 260 has a hollow area 264. The hollow area 264 is located at a position close to the left of the drawing and exposes a top surface of the ridge mesa 242 of the second semiconductor layer 240. In addition, the second zone 263 of the patterned insulating layer 260 covers rest of the second semiconductor layer 240, the first semiconductor layer 220 between the second semiconductor layer 240 and the current conducting layer 250, and the current conducting layer 250.

Similarly, in this embodiment, through a configuration of the flip chip type laser diode 200 that the first zone 261 and the second zone 263 of the patterned insulating layer 260 are arranged along an extending direction of the ridge mesa 242, and the patterned insulating layer 260 exposes a part of the current conducting layer 250 in the first region 261 and exposes a part of the second semiconductor layer 240 in the second region 263, a first electrode 270 and a second electrode 280 are disposed in a length direction of the flip chip type laser diode 200, such that the flip chip type laser diode 200 has only one electrode present in a width direction. Besides, compared with the flip chip type laser diode 100 in FIG. 2, the flip chip type laser diode 200 of this embodiment only has one current conducting layer 250 in the width direction, so a width of the flip chip type laser diode 200 may be further reduced.

In view of the foregoing, the flip chip type laser diode of this invention is packaged into the flip chip type laser diode package structure by bonding with the package substrate through the first electrode and the second electrode by direct bonding.

Such design saves the area taken up by the bonding wire structure for bonding wire connection in the conventional art, so the width of the flip chip type laser diode is significantly reduced. Moreover, the flip chip type laser diode of the invention allows the first electrode and the second electrode to be disposed along the extending direction of the ridge mesa through the configuration that the first zone and the second zone of the patterned insulating layer are arranged along the extending direction of the ridge mesa, and the patterned insulating layer exposes a part of the current conducting layer in the first zone and a part of the second semiconductor layer in the second zone. In other words, the flip chip type laser diode only has one electrode present in the width direction, so the width of the flip chip type laser diode is further reduced. In addition, the flip chip type laser diode may also have only one current conducting layer, so the width of the flip chip type laser diode is additionally reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flip chip type laser diode, comprising:
   a first substrate;
   a first semiconductor layer, disposed on the first substrate;
   an emitting layer, disposed on a part of the first semiconductor layer;
   a second semiconductor layer, disposed on the emitting layer and forming a ridge mesa;
   at least one current conducting layer, disposed on a part of the first semiconductor layer, wherein the at least one current conducting layer is electrically connected with the first semiconductor layer and isolated from the second semiconductor layer;
   a patterned insulating layer, covering the first semiconductor layer, the emitting layer, the second semiconductor layer, and the at least one current conducting layer and comprising a first zone and a second zone, wherein the first zone exposes a part of the at least one current conducting layer, and the second zone exposes a part of the second semiconductor layer;
   a first electrode, disposed in the first zone of the patterned insulating layer; and
   a second electrode, disposed in the second zone of the patterned insulating layer, wherein a projection of the ridge mesa projected to the first substrate respectively covers a part of a projection of the first electrode and a part of a projection of the second electrode projected to the first substrate, wherein polarity of the first electrode and polarity of the second electrode are reversed, and the first electrode and the second electrode are disposed at the same side of the first substrate.

2. The flip chip type laser diode as claimed in claim 1, wherein the number of the at least one current conducting layer is one, and the current conducting layer is located at one side of the ridge mesa.

3. The flip chip type laser diode as claimed in claim 1, wherein the number of the at least one current conducting layer is two, and the two current conducting layers are located at two sides of the ridge mesa.

4. The flip chip type laser diode as claimed in claim 1, wherein a cross-section of the flip chip type laser diode cross-cuts the ridge mesa and the at least one current conducting layer, and a width of the cross-section of the flip chip type laser diode is less than 100 micrometers.

5. The flip chip type laser diode as claimed in claim 1, wherein a cross-section of the flip chip type laser diode cross-cuts the ridge mesa and the at least one current conducting layer, a ratio between a width of the ridge mesa and a width of the cross-section of the flip chip type laser diode is approximately from 0.01 to 0.5, and a range of the width of the ridge mesa is approximately from 1 to 50 micrometers.

6. The flip chip type laser diode as claimed in claim 1, wherein the first electrode and the second electrode are electrically connected with a third electrode and a fourth electrode of a package substrate.

* * * * *